(12) United States Patent
Wang

(10) Patent No.: US 11,177,456 B2
(45) Date of Patent: Nov. 16, 2021

(54) DISPLAY SUBSTRATE, DISPLAY APPARATUS, AND METHOD OF FABRICATING DISPLAY SUBSTRATE

(71) Applicant: BOE Technology Group Co., Ltd., Beijing (CN)

(72) Inventor: Tao Wang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 587 days.

(21) Appl. No.: 16/080,981

(22) PCT Filed: Aug. 21, 2017

(86) PCT No.: PCT/CN2017/098251
§ 371 (c)(1),
(2) Date: Aug. 29, 2018

(87) PCT Pub. No.: WO2019/036832
PCT Pub. Date: Feb. 28, 2019

(65) Prior Publication Data
US 2021/0210720 A1 Jul. 8, 2021

(51) Int. Cl.
*H01L 51/52* (2006.01)
*H01L 51/56* (2006.01)
*H01L 27/32* (2006.01)
*H01L 51/00* (2006.01)

(52) U.S. Cl.
CPC .......... *H01L 51/5253* (2013.01); *H01L 51/56* (2013.01); *H01L 27/3244* (2013.01); *H01L 51/0097* (2013.01); *H01L 2227/323* (2013.01); *H01L 2251/5338* (2013.01); *H01L 2251/566* (2013.01)

(58) Field of Classification Search
None
See application file for complete search history.

(56) References Cited

U.S. PATENT DOCUMENTS

| 9,287,335 B2 | 3/2016 | Yi |
| 9,818,977 B2 * | 11/2017 | Hack .................. H01L 51/0097 |
| 2002/0140347 A1 | 10/2002 | Weaver |

(Continued)

FOREIGN PATENT DOCUMENTS

| CN | 104103581 A | 10/2014 |
| CN | 104638201 A | 5/2015 |

(Continued)

OTHER PUBLICATIONS

International Search Report & Written Opinion dated May 30, 2018, regarding PCT/CN2017/098251.
First Office Action in the Japanese Patent Application No. 2019547986, dated Sep. 15, 2020; English translation attached.

(Continued)

*Primary Examiner* — J. E. Schoenholtz
(74) *Attorney, Agent, or Firm* — Intellectual Valley Law, P.C.

(57) ABSTRACT

The present application discloses a method of fabricating a display substrate. The method includes forming a mother substrate on a support substrate; cutting the mother substrate to separate a portion of the mother substrate from a remainder of the mother substrate, thereby forming a base substrate; and subsequent to cutting the mother substrate, forming an encapsulating layer on the base substrate for encapsulating the display substrate.

18 Claims, 6 Drawing Sheets

(56) References Cited

U.S. PATENT DOCUMENTS

| | | | |
|---|---|---|---|
| 2003/0207500 A1* | 11/2003 | Pichler | H01L 51/5253 |
| | | | 438/127 |
| 2004/0043525 A1 | 3/2004 | Ohata et al. | |
| 2005/0146266 A1 | 7/2005 | Eida et al. | |
| 2013/0241076 A1* | 9/2013 | Mandlik | H01L 51/52 |
| | | | 257/774 |
| 2015/0255522 A1 | 9/2015 | Sato et al. | |
| 2015/0372255 A1 | 12/2015 | Fukumoto | |
| 2016/0064688 A1 | 3/2016 | Osaki | |
| 2016/0248045 A1* | 8/2016 | Hack | H01L 51/52 |
| 2017/0018732 A1 | 1/2017 | Mandlik et al. | |
| 2017/0040568 A1 | 2/2017 | Bai et al. | |
| 2017/0062757 A1 | 3/2017 | Zhou | |
| 2017/0221982 A1* | 8/2017 | Park | H01L 51/0096 |
| 2017/0324065 A1 | 11/2017 | Lang et al. | |
| 2019/0165272 A1* | 5/2019 | Kang | H01L 51/003 |
| 2019/0273218 A1* | 9/2019 | Wang | H01L 51/524 |
| 2020/0058886 A1* | 2/2020 | Yuan | H01L 51/5253 |

FOREIGN PATENT DOCUMENTS

| | | |
|---|---|---|
| CN | 105226079 A | 1/2016 |
| CN | 105609655 A | 5/2016 |
| JP | H09330789 A | 12/1997 |
| JP | 2004095330 A | 3/2004 |
| JP | 2006330059 A | 12/2006 |
| JP | 2007273274 A | 10/2007 |
| JP | 2009181865 A | 8/2009 |
| JP | 2011108564 A | 6/2011 |
| JP | 2014048619 A | 3/2014 |
| JP | 2015169711 A | 9/2015 |
| JP | 2016021384 A | 2/2016 |
| WO | 03069957 A1 | 8/2003 |
| WO | 2014163104 A1 | 10/2014 |
| WO | 2016078915 A1 | 5/2016 |

OTHER PUBLICATIONS

Extended European Search Report in the European Patent Application No. 17922179.1, dated Jun. 4, 2021.

* cited by examiner

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2017/098251, filed Aug. 21, 2017, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD. An OLED display apparatus typically includes an anode, an organic layer including a light emitting layer, and a cathode. OLEDs can be either a bottom-emission type OLED or a top-emission type OLED.

SUMMARY

In one aspect, the present disclosure provides a method of fabricating a display substrate, comprising forming a mother substrate on a support substrate; cutting the mother substrate to separate a portion of the mother substrate from a remainder of the mother substrate, thereby forming a base substrate; and subsequent to cutting the mother substrate, forming an encapsulating layer on the base substrate for encapsulating the display substrate.

Optionally, a part of the encapsulating layer is formed substantially surrounding at least a part of a side surface of the base substrate.

Optionally, cutting the mother substrate is performed using a laser.

Optionally, the method further comprises forming a plurality of thin film transistors; wherein forming the encapsulating layer comprises depositing an encapsulating material on side of the plurality of thin film transistors distal to the base substrate.

Optionally, cutting the mother substrate is performed to form the base substrate having a top surface, a bottom surface opposite to the top surface, and a side surface connecting the top surface and the bottom surface, the top surface being on a side of the bottom surface proximal to the plurality of thin film transistors, the bottom surface being on a side of the top surface distal to the plurality of thin film transistors; depositing the encapsulating material is performed to form the encapsulating layer having a top part and a side part connected to the top part, the top part being on a side of the plurality of thin film transistors distal to the base substrate for encapsulating the display substrate; and the side part of the encapsulating layer is formed to encapsulate a side of the display substrate and substantially surround the side surface of the base substrate.

Optionally, depositing the encapsulating material is performed using a mask plate having an aperture corresponding to the display substrate; and a projection of an edge of the mask plate surrounding the aperture on the support substrate is spaced apart from a projection of an edge of the base substrate on the support substrate by a distance in a range of approximately 1 μm to approximately 500 μm.

Optionally, the display substrate is an organic light emitting diode display substrate; prior to depositing the encapsulating material, the method further comprising forming a plurality of organic light emitting diodes on the base substrate.

Optionally, the mother substrate is formed using a flexible material.

In another aspect, the present disclosure provides a display substrate comprising a base substrate; a plurality of thin film transistors on the base substrate; and an encapsulating layer on a side of the plurality of thin film transistors distal to the base substrate for encapsulating the display substrate; wherein a part of the encapsulating layer substantially surrounds at least a part of a side surface of the base substrate.

Optionally, the base substrate comprises a top surface, a bottom surface opposite to the top surface, and a side surface connecting the top surface and the bottom surface, the top surface being on a side of the bottom surface proximal to the plurality of thin fin transistors, the bottom surface being on a side of the top surface distal to the plurality of thin film transistors; the encapsulating layer comprises a top part and a side part connected to the top part, the top part being on a side of the plurality of thin film transistors distal to the base substrate for encapsulating the display substrate; and the side part of the encapsulating layer encapsulates a side of the display substrate and substantially surrounds the side surface of the base substrate.

Optionally, the side part of the encapsulating layer substantially surrounds an entire perimeter of the side surface of the base substrate.

Optionally, the bottom surface of the base substrate constitutes a bottom surface of the display substrate.

Optionally, any signal line of the display substrate is on a side of the top surface distal to the bottom surface.

Optionally, a projection of the encapsulating layer on a plane containing the bottom surface of the base substrate substantially covers a projection of the base substrate on the plane containing the bottom surface of the base substrate.

Optionally, a contact interface between the encapsulating layer and the base substrate is substantially on the side surface of the base substrate.

Optionally, the display substrate further comprises a planarization layer on a side of the encapsulating layer distal to the base substrate; and an auxiliary encapsulating layer on a side of the planarization layer distal to the encapsulating layer.

Optionally, projections of the encapsulating layer and the auxiliary encapsulating layer on a plane containing the bottom surface of the base substrate substantially overlap with each other.

Optionally, the base substrate is a flexible base substrate.

Optionally, the display substrate is an organic light emitting diode display substrate further comprising a plurality of organic light emitting diodes on the base substrate and encapsulated by the encapsulating layer.

In another aspect, the present disclosure provides a display apparatus comprising the display substrate described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In a process of forming a conventional display substrate, e.g., a conventional organic light emitting diode display substrate, a plurality of display substrate units are formed on a mother substrate, an encapsulating layer is formed on top of the plurality of display substrate units to encapsulate the display elements therein, and subsequently the mother substrate is cut to separate the plurality of display substrate units thereby forming individual display substrates. In the process of cutting the mother substrate, it is also necessary to cut the encapsulating layer which is formed (prior to cutting) to encapsulate the entire area of the plurality of display substrate units.

Typically the encapsulating layer includes an inorganic encapsulating layer made of an inorganic insulating material having excellent oxygen and moisture resistance. Examples of such inorganic insulating materials include silicon oxide, silicon nitride, aluminum oxide, titanium oxide, or a combination thereof. These materials are relatively rigid and brittle. During the cutting process, often minor cracks are formed in the inorganic encapsulating layer, compromising the oxygen and moisture resistivity of the encapsulating layer.

Accordingly, the present disclosure provides, inter alia, a display substrate, a display apparatus having the same, and a fabricating method thereof that substantially obviate one or more of the problems due to limitations and disadvantages of the related art. In one aspect, the present disclosure provides a display substrate. In some embodiments, the display substrate includes a base substrate; a plurality of thin film transistors on the base substrate; and an encapsulating layer on a side of the plurality of thin film transistors distal to the base substrate for encapsulating the display substrate. A part of the encapsulating layer substantially surrounds at least a part of a side surface of the base substrate. As used herein, the term base substrate refers to the structure onto which a desired layer is grown. Optionally, the base substrate includes a single layer. Optionally, the base substrate includes a plurality of sub-layers. Optionally, the base substrate is a flexible base substrate. Optionally, the base substrate is the first layer on which a semiconductor fabrication process starts. In one example, prior to formation of semiconductor components or signal lines, a buffer layer may be first formed on the base substrate. In the context of the present disclosure, the buffer layer is not considered a part of the base substrate. Optionally, the base substrate forms the bottom surface of a display substrate.

Figure 1:
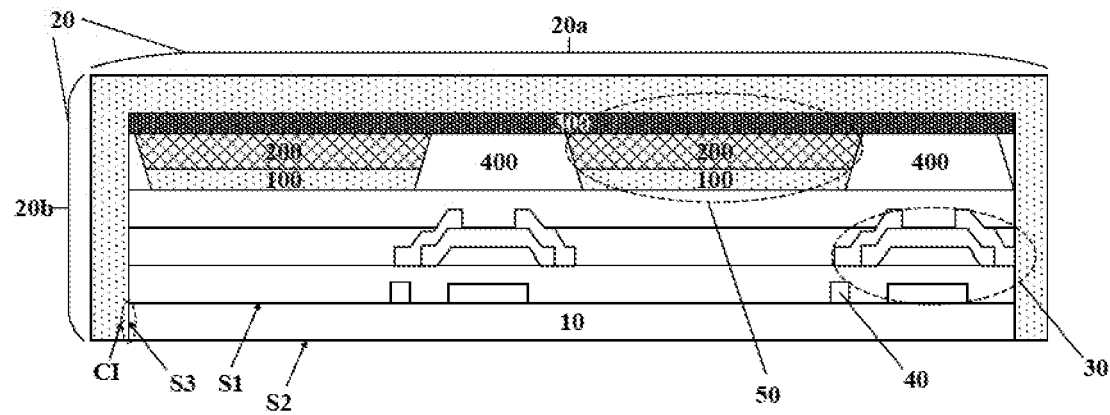
FIG. 1 is a schematic diagram illustrating the structure of a display substrate in some embodiments according to the present disclosure.

FIG. 1 is a schematic diagram illustrating the structure of a display substrate in some embodiments according to the present disclosure. Referring to FIG. 1, the display substrate in some embodiments includes a base substrate 10. The base substrate 10 has a top surface S1, a bottom surface S2 opposite to the top surface S1, and a side surface S3 connecting the top surface S1 and the bottom surface S2. The bottom surface S2 of the base substrate 10 forms the bottom surface of the display substrate. Various semiconductor components of the display substrate are formed on a side of the top surface S1 distal to the bottom surface S2. As shown in FIG. 1, a plurality of thin film transistors 30, a plurality of signal lines 40, and a plurality of organic light emitting diodes 50 are formed on a side of the top surface S1 distal to the bottom surface S2. Optionally, the display substrate may further include a buffer layer (or an intermediate layer) on a side of the top surface S1 distal to the bottom surface S2. Optionally, the display substrate further includes a pixel definition layer 400.

To encapsulate the semiconductor components of the display substrate, an encapsulating layer 20 is formed on a side of the plurality of organic light emitting diodes 50, the plurality of thin film transistors 30, and the plurality of signal lines 40 distal to the base substrate 10. In the present display substrate, a part of the encapsulating layer 20 substantially surrounds at least a part of the side surface S3 of the base substrate 10. As depicted in FIG. 1, the encapsulating layer 20 includes a top part 20a and a side part 20b connected to the top part 20a. The top part 20a and the side part 20b form an integral encapsulating layer 20. The top part 20a is on a side of the plurality of thin film transistors 30 distal to the base substrate 10. The side part 20b of the encapsulating layer 20 encapsulates a side of the display substrate. Moreover, the side part 20b substantially surrounds the side surface S3 of the base substrate 10.

Figure 2:
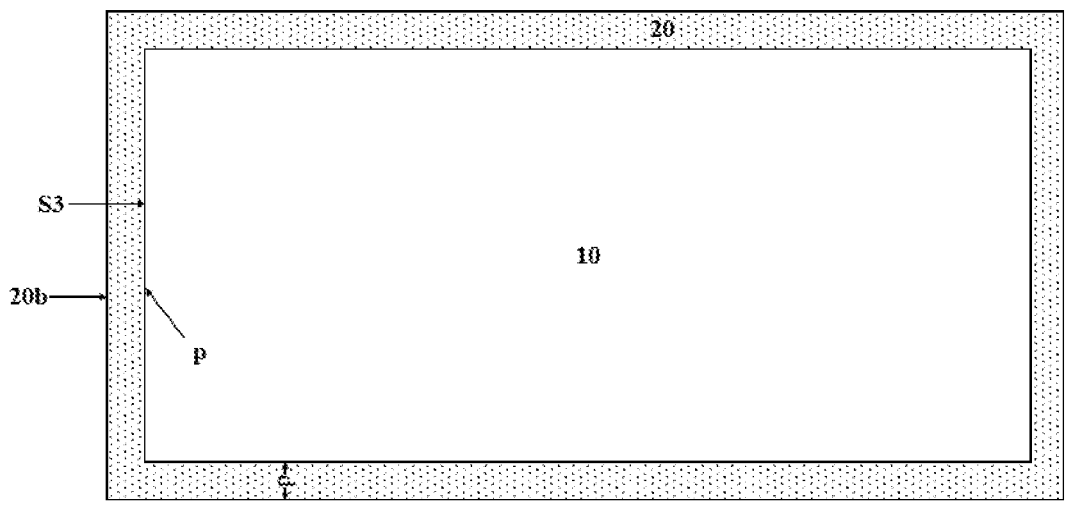
FIG. 2 is a bottom view of the display substrate in FIG. 1.

FIG. 2 is a bottom view of the display substrate in FIG. 1. Referring to FIG. 2, the side part 20b of the encapsulating layer 20 in some embodiments substantially surrounds an entire perimeter p of the side surface S3 of the base substrate 10. As shown in FIG. 1 and FIG. 2, a projection of the encapsulating layer 20 on a plane containing the bottom surface S2 of the base substrate 10 substantially covers a projection of the base substrate 10 on the plane containing the bottom surface S2 of the base substrate 10. Optionally, a projection of an outer edge of the encapsulating layer 20 on the plane containing the bottom surface S2 of the base substrate 10 is spaced apart from a projection of an outer edge of the base substrate 10 on the plane containing the bottom surface S2 of the base substrate 10 by a distance d. Optionally, the distance is in a range of 0 μm to approximately 1000 μm, e.g., approximately 1 μm to approximately 1000 μm, approximately 1 μm to approximately 500 μm, approximately 500 μm to approximately 1000 μm, approximately 1 µm to approximately 250 µm, and approximately 1 µm to approximately 100 µm.

Figure 3:
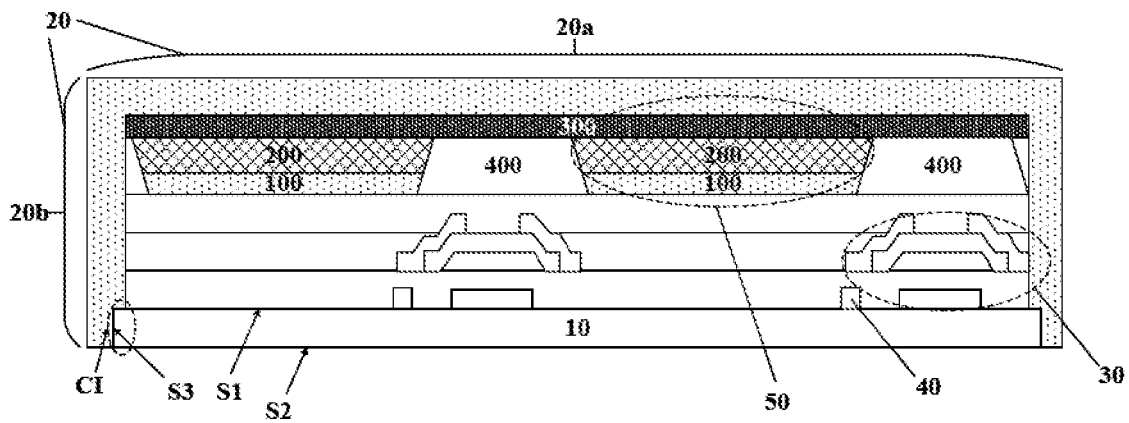
FIG. 3 is a schematic diagram illustrating the structure of a display substrate in some embodiments according to the present disclosure.

One striking difference between the present display substrate and a conventional display substrate is that a contact interface between the encapsulating layer 20 and the base substrate 10 is exclusively on the top surface S1 of the base substrate 10 in a conventional display substrate, whereas the contact interface between the encapsulating layer 20 and the base substrate 10 in the present display substrate is at least partially on the side surface S3 of the base substrate 10. Referring to FIG. 1, the side part 20b of the encapsulating layer 20 is in contact with the side surface S3 of the base substrate 10, and the contact interface CI is substantially on the side surface S3 of the base substrate 10. FIG. 3 is a schematic diagram illustrating the structure of a display substrate in some embodiments according to the present disclosure. The display substrate in FIG. 3 has a structure similar to that of the display substrate in FIG. 1 except that in the display substrate in FIG. 3 the contact interface CI is partially on the side surface S3 of the base substrate 10 and partially on the top surface S1 of the base substrate 10.

Accordingly, in some embodiments, a side surface of the display substrate does not include a side surface (e.g., the side surface S3) of the base substrate 10. In one example, the side surface S3 of the base substrate 10 is substantially covered by the side part 20b of the encapsulating layer 20.

Figure 4:
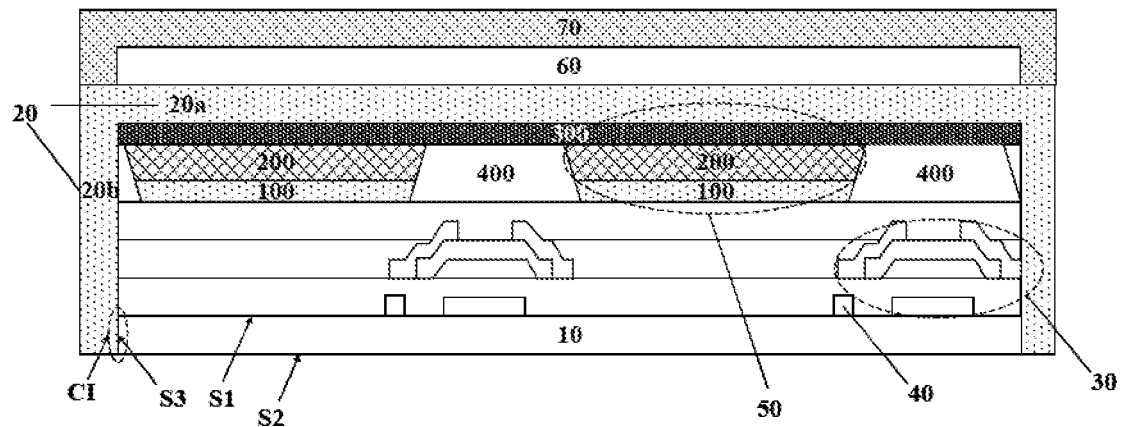
FIG. 4 is a schematic diagram illustrating the structure of a display substrate in some embodiments according to the present disclosure.

FIG. 4 is a schematic diagram illustrating the structure of a display substrate in some embodiments according to the present disclosure. Referring to FIG. 4, the display substrate in some embodiments further includes a planarization layer 60 on a side of the encapsulating layer 20 distal to the base substrate 10, and an auxiliary encapsulating layer 70 on a side of the planarization layer 60 distal to the encapsulating layer 20. Optionally, projections of the encapsulating layer 20 and the auxiliary encapsulating layer 70 on a plane containing the bottom surface S2 of the base substrate 10 substantially overlap with each other.

Various appropriate materials may be used for making the base substrate. Examples of materials suitable for making the base substrate include, but are not limited to, glass, quartz, polyimide, and polyester, etc. Optionally, the base substrate is a flexible base substrate (e.g., a polyimide base substrate). Optionally, the base substrate is a relatively inflexible base substrate (e.g., a glass base substrate).

In some embodiments, the display substrate is an organic light emitting display substrate. Optionally, the display substrate further includes a plurality of organic light emitting diodes 50 on the base substrate 10 and encapsulated by the encapsulating layer 20. In some embodiments, the display substrate is a liquid crystal display substrate.

In another aspect, the present disclosure provides a method of fabricating a display substrate. In some embodiments, the method includes forming a mother substrate on a support substrate; cutting the mother substrate to separate a portion of the mother substrate from a remainder of the mother substrate, thereby forming a base substrate; and subsequent to cutting the mother substrate, forming an encapsulating layer on the base substrate for encapsulating the display substrate. Optionally, a part of the encapsulating layer is formed substantially surrounding at least a part of a side surface of the base substrate. Optionally, cutting the mother substrate is performed using a laser. Optionally, the method further includes forming a plurality of thin film transistors, and the encapsulating layer is formed on a side of the plurality of thin film transistors distal to the base substrate. Optionally, the step of forming the encapsulating layer includes depositing an encapsulating material on side of the plurality of thin film transistors distal to the base substrate. Optionally, the mother substrate is formed using a flexible material.

In some embodiments, the plurality of thin film transistors are formed on the mother substrate, and the step of forming the plurality of thin film transistors is performed prior to the step of cutting the mother substrate. In some embodiments, the plurality of thin film transistors are formed on the base substrate, and the step of forming the plurality of thin film transistors is performed subsequent to the step of cutting the mother substrate.

In some embodiments, the step of cutting the mother substrate is performed to form a base substrate having a top surface, a bottom surface opposite to the top surface, and a side surface connecting the top surface and the bottom surface. The top surface is formed on a side of the bottom surface proximal to the plurality of thin film transistors. The bottom surface is formed on a side of the top surface distal to the plurality of thin film transistors. Subsequently, the step of depositing the encapsulating material is performed to form an encapsulating layer having a top part and a side part connected to the top part, the top part being on a side of the plurality of thin film transistors distal to the base substrate for encapsulating the display substrate. Optionally, the side part of the encapsulating layer is formed to encapsulate a side of the display substrate and substantially surrounds the side surface of the base substrate.

In some embodiments, the step of depositing the encapsulating material is performed using a mask plate having an aperture corresponding to the display substrate. Optionally, a projection of an edge of the mask plate surrounding the aperture on the support substrate is spaced apart from a projection of an edge of the base substrate on the support substrate by a distance d. Optionally, the distance d is in a range of approximately 1 µm to approximately 500 µm.

In some embodiments, the display substrate is an organic light emitting diode display substrate, and the method further includes, prior to depositing the encapsulating material, forming a plurality of organic light emitting diodes on the base substrate.

Figure 5A:
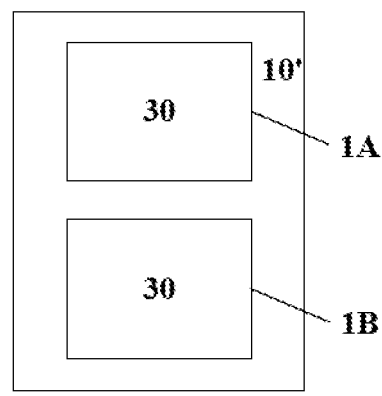
FIGS. 5A to 5H illustrate a process of fabricating a display substrate in some embodiments according to the present disclosure.
Figure 5B:
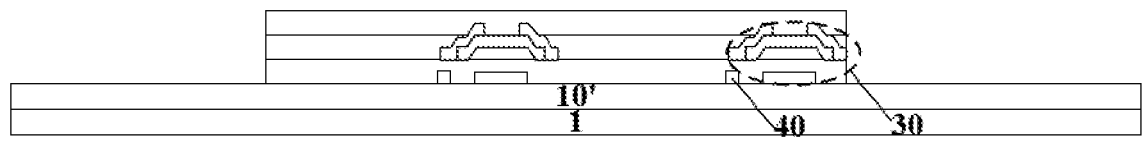
Figure 5C:
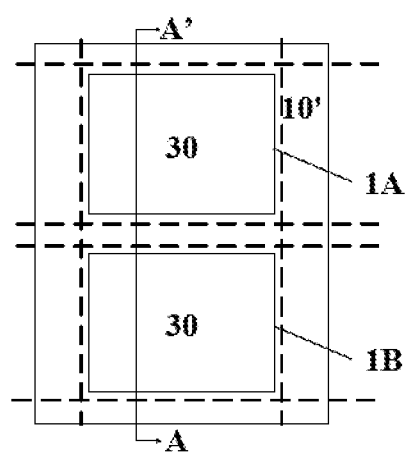
Figure 5D:
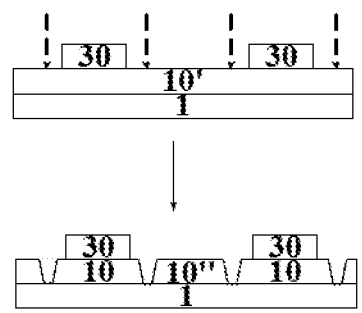
Figure 5E:
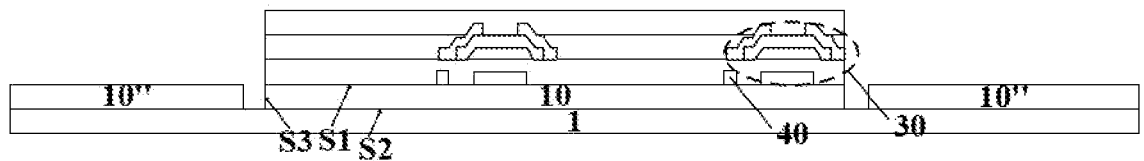

FIGS. 5A to 5H illustrate a process of fabricating a display substrate in some embodiments according to the present disclosure. Referring to FIG. 5A, a plurality of thin film transistors 30 are formed on a mother substrate 10'. A plurality of display substrate units (e.g., a first display substrate unit 1A and a second display substrate unit 1B) corresponding to a plurality of display substrates may be formed on the mother substrate 10'. FIG. 5B illustrates a portion of the mother substrate 10' corresponding to the first display substrate unit 1A in FIG. 5A. Referring to FIG. 5B, the mother substrate 10' is formed on a support substrate 1 such as a glass substrate. Semiconductor processing is performed to form various semiconductor components such as various layers, various signal lines 40, and the plurality of thin film transistors 30 on the mother substrate 10'. Referring to FIG. 5C, the mother substrate 10' is then cut along the dotted line. The area enclosed by the dotted line may be slightly larger than that of a display area of a display substrate unit, e.g., to form a display substrate having a relatively small peripheral area. FIG. 5D shows a cross-sectional view of the substrate in FIG. 5C. As shown in FIG. 5D, the mother substrate 10' is cut all the way through its depth, thereby separating a portion of the mother substrate 10' from a remainder 10" of the mother substrate. The separated portion of the mother substrate is the base substrate 10 of the display substrate to be formed. Optionally, the cutting step may be performed by laser cutting. FIG. 5E shows a substrate subsequent to the step of cutting the mother substrate. As shown in FIG. 5E, the base substrate 10 is formed to have a top surface S1, a bottom surface S2 opposite to the top surface S1, and a side surface S3 connecting the top surface S1 and the bottom surface S2. The top surface S1 is on a side of the bottom surface S2 proximal to the plurality of thin film transistors 30. The bottom surface S2 is on a side of the top surface S1 distal to the plurality of thin film transistors 30.

Figure 5F:
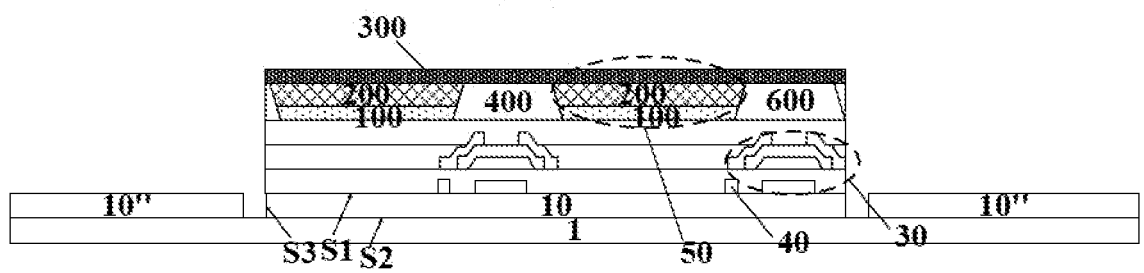

Referring to FIG. 5F, the method in some embodiments further includes forming a plurality of organic light emitting diodes 50 on a side of the plurality of thin film transistors 30 distal to the base substrate 10. This step may be performed prior to the step of cutting the mother substrate. Optionally, this plurality of organic light emitting diodes 50 are formed subsequent to the step of cutting the mother substrate. Each of the plurality of organic light emitting diodes 50 includes an anode 100, an organic light emitting layer 200, and a cathode 300.

Figure 5G:
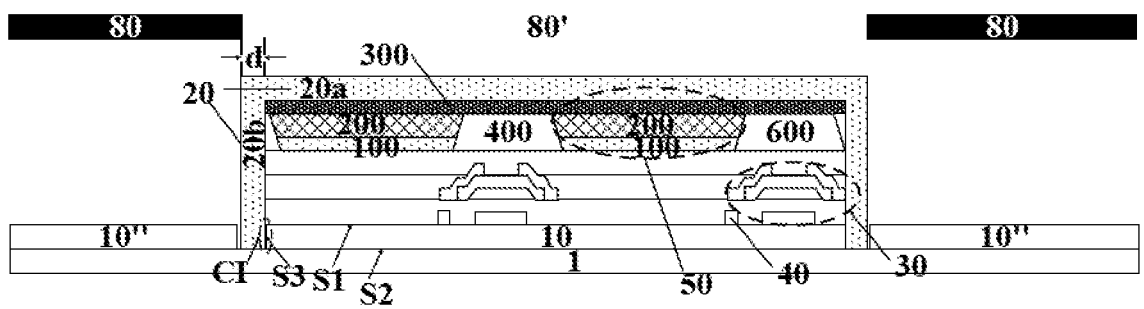

Referring to FIG. 5G, subsequent to the step of cutting the mother substrate, an encapsulating material is deposited on a side of the plurality of thin film transistors 30 and the plurality of organic light emitting diodes 50 distal to the base substrate 10 for encapsulating the display elements in the display substrate. As shown in FIG. 5G, an encapsulating layer 20 is formed to have a top part 20a and a side part 20b connected to the top part 20a. The top part 20a is formed on a side of the plurality of thin film transistors 30 distal to the base substrate 10. The side part 20b of the encapsulating layer 20 is formed to encapsulate a side of the display substrate.

The step of depositing the encapsulating material may be performed using a mask plate 80 having an aperture 80' corresponding to the area of the display substrate to be formed. A size of the aperture 80' may be selected based on a desired thickness of the side part 20b of the encapsulating layer 20. A projection of an edge of the mask plate 80 surrounding the aperture 80' on the support substrate 1 is spaced apart from a projection of an edge of the base substrate 10 on the support substrate 1 by a distance d. Optionally, the distance is in a range of 0 μm to approximately 1000 μm, e.g., approximately 1 μm to approximately 1000 μm, approximately 1 μm to approximately 500 μm, approximately 500 μm to approximately 1000 μm, approximately 1 μm to approximately 250 μm, and approximately 1 μm to approximately 100 μm. Optionally, the step of depositing the encapsulating material may be performed using a vapor deposition method, e.g., plasma-enhanced chemical vapor deposition (PECVD).

In some embodiments, the side part 20b of the encapsulating layer 20 is formed on at least a part of a side surface S3 of the base substrate 10. Optionally, the side part 20b of the encapsulating layer 20 is formed substantially surrounding at least a part of the side surface S3 of the base substrate 10. Optionally, the side part 20b of the encapsulating layer 20 is formed substantially surrounding the side surface S3 of the base substrate 10, as depicted in FIG. 5G. Referring to FIG. 2, the side part 20b of the encapsulating layer 20 in some embodiments is formed substantially surrounding an entire perimeter p of the side surface S3 of the base substrate 10.

In some embodiments, the contact interface CI between the encapsulating layer 20 and the base substrate 10 in the display substrate fabricated by the present method is at least partially on the side surface S3 of the base substrate 10. Referring to FIG. 5G, the side part 20b of the encapsulating layer 20 is in contact with the side surface S3 of the base substrate 10, and the contact interface CI is substantially on the side surface S3 of the base substrate 10. Referring to FIG. 3, in some embodiments, the contact interface CI is partially on the side surface S3 of the base substrate 10 and partially on the top surface S1 of the base substrate 10.

Figure 5H:
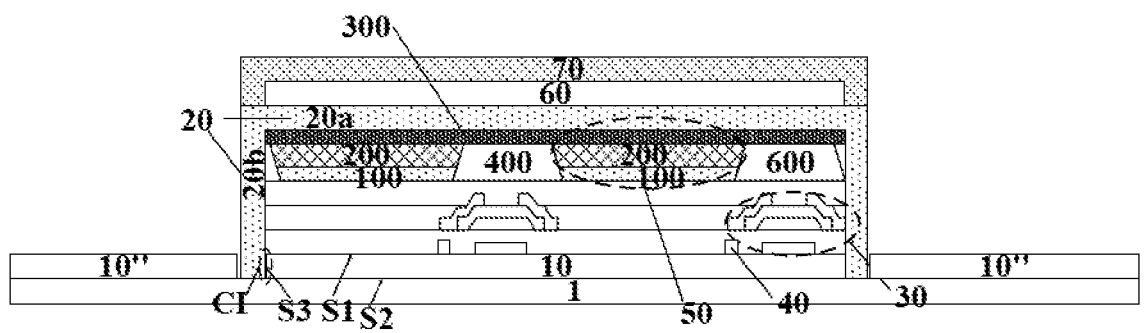
Figure 6A:
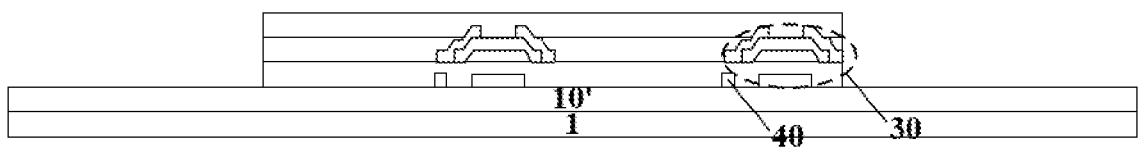
FIGS. 6A to 6E illustrate a process of fabricating a display substrate in some embodiments according to the present disclosure.
Figure 6B:
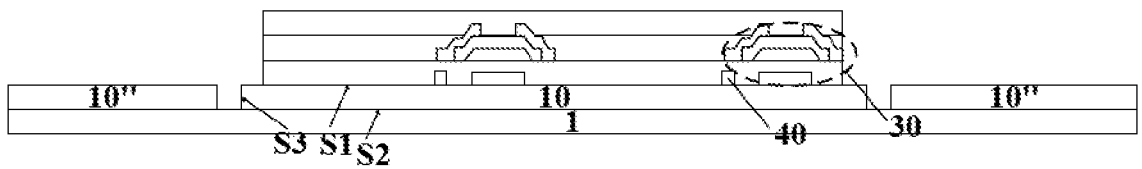
Figure 6C:
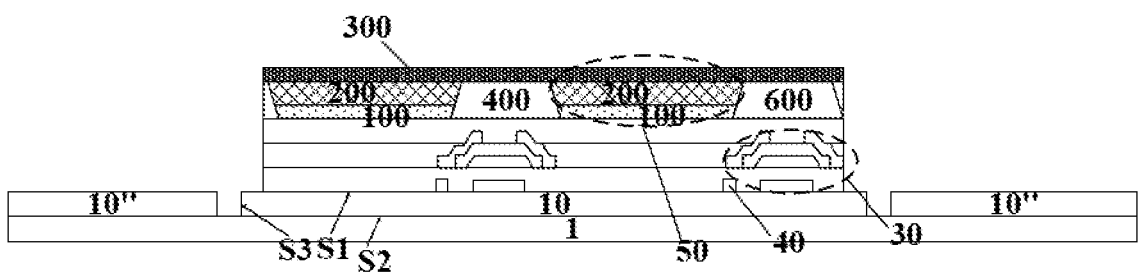
Figure 6D:
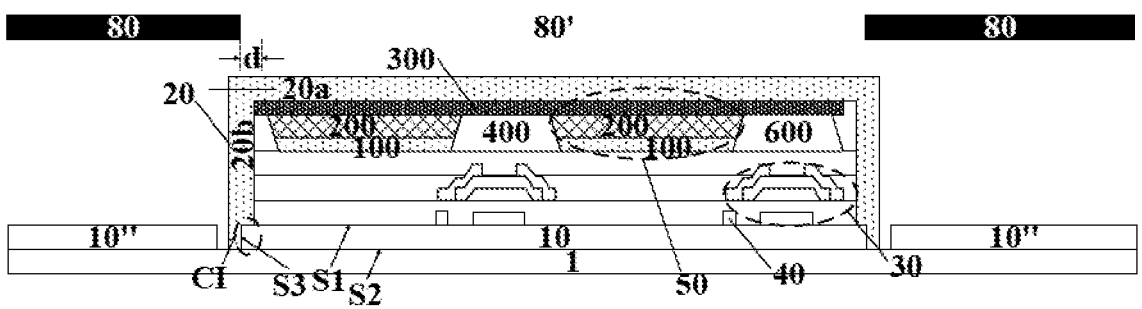
Figure 6E:
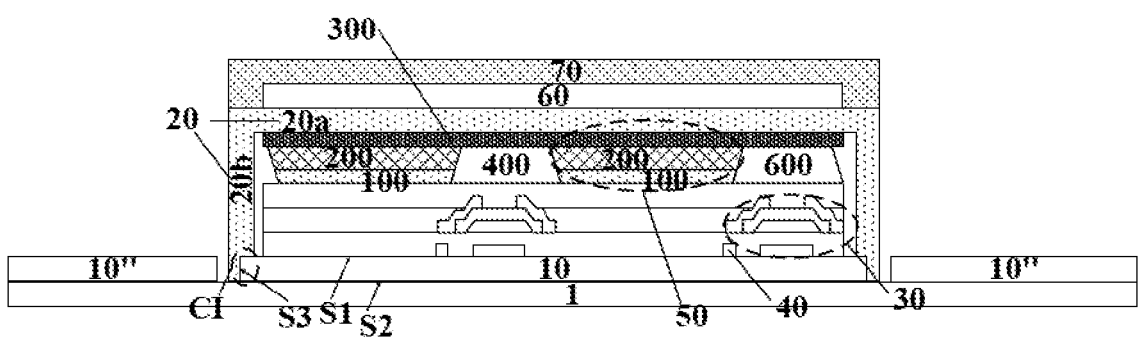

Referring to FIG. 5H, subsequent to the step of forming the encapsulating layer 20, a planarization layer 60 is formed on a side of the encapsulating layer 20 distal to the base substrate 10; and an auxiliary encapsulating layer 70 is formed on a side of the planarization layer 60 distal to the encapsulating layer 20. The display substrate is then removed from (e.g., peeled from) the support substrate 1, thereby forming the display substrate.

In the processes depicted in FIGS. 5A to 5H, the plurality of thin film transistors 30 are formed prior to the step of cutting the mother substrate. Optionally, the step of forming the plurality of thin film transistors 30 is performed subsequent to the step of cutting the mother substrate.

In the present method, the cutting process is performed prior to forming the encapsulating layer. Accordingly, the encapsulating layer in the present method is never cut in the fabrication process, and remains intact throughout the process. Accordingly, the problem associated with cracks produced by cutting the encapsulating layer can be obviated. As a result, a display substrate fabricated by the present method has extraordinary oxygen and moisture resistance.

FIGS. 6A to 6E illustrate a process of fabricating a display substrate in some embodiments according to the present disclosure. The process illustrated in FIGS. 6A to 6E is similar to that depicted in FIGS. 5A to 5H except that the step of cutting the mother substrate 10' is performed at a different cutting position such that the contact interface CI is partially on the side surface S3 of the base substrate 10 and partially on the top surface S1 of the base substrate 10. Various alternative implementations of the present method may be practiced to make the display substrate.

Figure 7:
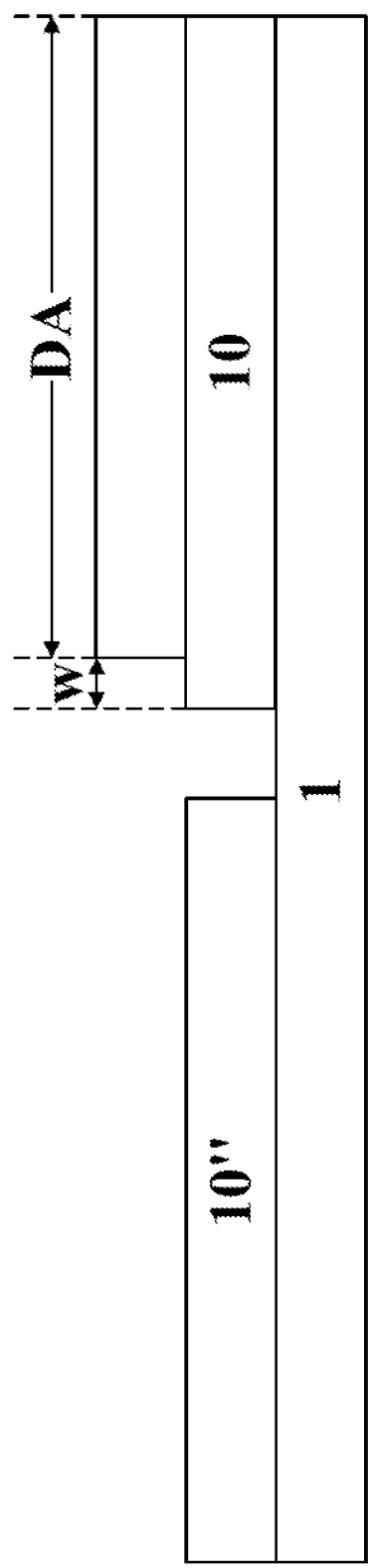
FIG. 7 illustrates a cutting position on the mother substrate in some embodiments according to the present disclosure.

FIG. 7 illustrates a cutting position on the mother substrate in some embodiments according to the present disclosure. Referring to FIG. 7, the cutting position on the mother substrate may be selected to have a width w from the edge of the display area DA of the display substrate. Optionally, the width w is in a range of 0 mm to approximately 5 mm, e.g., approximately 0.1 mm to approximately 5 mm, approximately 0.1 mm to approximately 2.5 mm, and approximately 2.5 mm to approximately 5 mm. A smaller width w corresponds to a smaller peripheral area of the display substrate.

In the processes depicted in FIGS. 6A to 6E, the plurality of thin film transistors 30 are formed prior to the step of cutting the mother substrate. Optionally, the step of forming the plurality of thin film transistors 30 is performed subsequent to the step of cutting the mother substrate.

In another aspect, the present disclosure provides a display apparatus having a display substrate described herein or fabricated by a method described herein. Optionally, the display apparatus is an organic light emitting diode display apparatus. Optionally, the display apparatus is a liquid crystal display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display substrate, comprising:
    forming a mother substrate on a support substrate;
    cutting the mother substrate to separate a portion of the mother substrate from a remainder of the mother substrate, thereby forming a base substrate; and
    subsequent to cutting the mother substrate, forming an encapsulating layer on the base substrate for encapsulating the display substrate.

2. The method of claim 1, wherein a part of the encapsulating layer is formed substantially surrounding at least a part of a side surface of the base substrate.

3. The method of claim 1, wherein cutting the mother substrate is performed using a laser.

4. The method of claim 1, further comprising forming a plurality of thin film transistors; wherein forming the encapsulating layer comprises depositing an encapsulating material on side of the plurality of thin film transistors distal to the base substrate.

5. The method of claim 4, wherein cutting the mother substrate is performed to form the base substrate having a top surface, a bottom surface opposite to the top surface, and a side surface connecting the top surface and the bottom surface, the top surface being on a side of the bottom surface proximal to the plurality of thin film transistors;
    depositing the encapsulating material is performed to form the encapsulating layer having a top part and a side part connected to the top part, the top part being on a side of the plurality of thin film transistors distal to the base substrate for encapsulating the display substrate; and
    the side part of the encapsulating layer is formed to encapsulate a side of the display substrate and substantially surrounds the side surface of the base substrate.

6. The method of claim 4, wherein depositing the encapsulating material is performed using a mask plate having an aperture corresponding to the display substrate; and
    a projection of an edge of the mask plate surrounding the aperture on the support substrate is spaced apart from a projection of an edge of the base substrate on the support substrate by a distance in a range of approximately 1 μm to approximately 500 μm.

7. The method of claim 4, wherein the display substrate is an organic light emitting diode display substrate;
    prior to depositing the encapsulating material, the method further comprising forming a plurality of organic light emitting diodes on the base substrate.

8. The method of claim 7, wherein the mother substrate is formed using a flexible material.

9. A display substrate, comprising:
    a base substrate;
    a plurality of thin film transistors on the base substrate;
    an encapsulating layer on a side of the plurality of thin film transistors distal to the base substrate for encapsulating the display substrate;
    a planarization layer on a side of the encapsulating layer distal to the base substrate; and
    an auxiliary encapsulating layer on a side of the planarization layer distal to the encapsulating layer;
    wherein a part of the encapsulating layer substantially surrounds at least a part of a side surface of the base substrate;
    the base substrate comprises a top surface, a bottom surface opposite to the top surface, and a side surface connecting the top surface and the bottom surface, the top surface being on a side of the bottom surface proximal to the plurality of thin film transistors
    the encapsulating layer comprises a top part and a side part connected to the top part, the top part being on a side of the plurality of thin film transistors distal to the base substrate for encapsulating the display substrate; and
    the side part of the encapsulating layer encapsulates a side of the display substrate and substantially surrounds the side surface of the base substrate.

10. The display substrate of claim 9, wherein the side part of the encapsulating layer substantially surrounds an entire perimeter of the side surface of the base substrate.

11. The display substrate of claim 9, wherein the bottom surface of the base substrate constitutes a bottom surface of the display substrate.

12. The display substrate of claim 9, wherein any signal line of the display substrate is on a side of the top surface distal to the bottom surface.

13. The display substrate of claim 9, wherein a projection of the encapsulating layer on a plane containing the bottom surface of the base substrate substantially covers a projection of the base substrate on the plane containing the bottom surface of the base substrate.

14. The display substrate of claim 9, wherein a contact interface between the encapsulating layer and the base substrate is substantially on the side surface of the base substrate.

15. The display substrate of claim 9, wherein projections of the encapsulating layer and the auxiliary encapsulating layer on a plane containing the bottom surface of the base substrate substantially overlap with each other.

16. The display substrate of claim 9, wherein the base substrate is a flexible base substrate.

17. The display substrate of claim 9, wherein the display substrate is an organic light emitting diode display substrate further comprising a plurality of organic light emitting diodes on the base substrate and encapsulated by the encapsulating layer.

18. A display apparatus, comprising the display substrate of claim 9.

* * * * *